(12) United States Patent
Jiang et al.

(10) Patent No.: US 10,319,899 B2
(45) Date of Patent: Jun. 11, 2019

(54) METHOD OF FORMING A SEMICONDUCTOR DEVICE (71) Applicant: Texas Instruments Incorporated, Dallas, TX (US)

(72) Inventors: Neng Jiang, Plano, TX (US); Xin Li, Carrollton, TX (US); Joel Soman, Dallas, TX (US); Thomas Warren Lassiter, Garland, TX (US); Mary Alyssa Drummond Roby, Plano, TX (US); YungShan Chang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/669,309

(22) Filed: Aug. 4, 2017

(65) Prior Publication Data
US 2017/0338401 A1 Nov. 23, 2017

Related U.S. Application Data (63) Continuation of application No. 14/738,847, filed on Jun. 13, 2015, now Pat. No. 9,755,139.
(Continued)

(51) Int. Cl.
H01L 41/332 (2013.01)
H01L 41/187 (2006.01)
(Continued)

(52) U.S. Cl.
CPC ........ *H01L 41/332* (2013.01); *H01L 41/1876* (2013.01); *H01L 41/25* (2013.01); *H01L 41/253* (2013.01); *H01L 41/314* (2013.01)

(58) Field of Classification Search
CPC ......... H01L 21/02008; H01L 21/02019; H01L 21/0038; H01L 21/0274; H01L 41/1876;
(Continued)

(56) References Cited

U.S. PATENT DOCUMENTS 5,484,073 A * 1/1996 Erickson ............. G01P 15/0802
148/DIG. 12
6,256,849 B1 7/2001 Kim
(Continued)

FOREIGN PATENT DOCUMENTS

JP 2000015822 A * 1/2000

*Primary Examiner* — Carl J Arbes
(74) *Attorney, Agent, or Firm* — Jacqueline J. Garner; Charles A. Brill; Frank D. Cimino (57) ABSTRACT A microelectronic device containing a piezoelectric thin film element is formed by oxidizing a top surface of a piezoelectric layer with an oxygen plasma, and subsequently forming an etch mask containing photoresist on the oxidized top surface. The etch mask is conditioned with an oven bake followed by a UV bake. The piezoelectric layer is etched using a three step process: a first step includes a wet etch of an aqueous solution of about 5% $NH_4F$, about 1.2% HF, and about 18% HCl, maintaining a ratio of the HCl to the HF of about 15.0, which removes a majority of the piezoelectric layer. A second step includes an agitated rinse. A third step includes a short etch in the aqueous solution of $NH_4F$, HF, and HCl.

20 Claims, 10 Drawing Sheets

Related U.S. Application Data

(60) Provisional application No. 62/018,756, filed on Jun. 30, 2014.

(51) Int. Cl.
  *H01L 41/25* (2013.01)
  *H01L 41/253* (2013.01)
  *H01L 41/314* (2013.01)

(58) Field of Classification Search
  CPC ..... H01L 41/25; H01L 41/253; H01L 41/314; H01L 41/332
  See application file for complete search history.

(56) References Cited

U.S. PATENT DOCUMENTS

| | | | | |
|---|---|---|---|---|
| 6,367,133 | B2* | 4/2002 | Ikada | H03H 3/08 |
| | | | | 29/25.35 |
| 6,561,634 | B1* | 5/2003 | Nishikawa | B41J 2/161 |
| | | | | 347/71 |
| 6,705,709 | B2* | 3/2004 | Nishikawa | B41J 2/161 |
| | | | | 347/68 |
| 6,936,371 | B2 | 8/2005 | Komori | |
| 6,964,928 | B2* | 11/2005 | Ying | B82Y 25/00 |
| | | | | 134/1.1 |
| 7,805,820 | B2* | 10/2010 | Eggs | H03H 3/02 |
| | | | | 216/41 |
| 7,882,607 | B2 | 2/2011 | Li | |
| 7,935,264 | B2 | 5/2011 | Nozu | |
| 8,500,253 | B2 | 8/2013 | Mita | |
| 2014/0059821 | A1* | 3/2014 | Matsuda | B06B 1/06 |
| | | | | 29/25.35 |

\* cited by examiner

METHOD OF FORMING A SEMICONDUCTOR DEVICE

CROSS-REFERENCE TO RELATED APPLICATIONS

This application is a continuation of U.S. Nonprovisional patent application Ser. No. 14/738,847, filed Jun. 13, 2015, which claims the benefit of U.S. Provisional Application Ser. No. 62/018,756, filed Jun. 30, 2014, the contents of both of which are herein incorporated by reference in its entirety.

FIELD OF THE INVENTION

This invention relates to the field of microelectronic devices. More particularly, this invention relates to piezoelectric layers in microelectronic devices.

BACKGROUND OF THE INVENTION

Some microelectronic devices containing a component with a piezoelectric element are fabricated by forming an etch mask on the layer of piezoelectric material and etching the piezoelectric material to define the piezoelectric element. Etching the piezoelectric material is problematic. Dry etching the piezoelectric material is difficult for layers over a micron thick due to etch residue buildup and mask erosion. Wet etching the piezoelectric material undesirably undercuts the mask in an uncontrollable manner and lifts the mask from the piezoelectric material, producing undesired profiles in the piezoelectric element.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microelectronic device containing a piezoelectric thin film element at least 1 micron thick is formed by oxidizing a top surface of a piezoelectric layer with an oxygen plasma, and subsequently forming an etch mask containing photoresist on the oxidized top surface. The etch mask is conditioned with an oven bake followed by an ultraviolet (UV) bake. The piezoelectric layer is etched using a three step process: a first step includes a wet etch of an aqueous solution of about 5% $NH_4F$, about 1.2% HF, and about 18% HCl, maintaining a ratio of the HCl to the HF of about 15.0, which removes a majority of the piezoelectric layer. A second step includes an agitated rinse. A third step includes a short etch in the aqueous solution of $NH_4F$, HF, and HCl.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
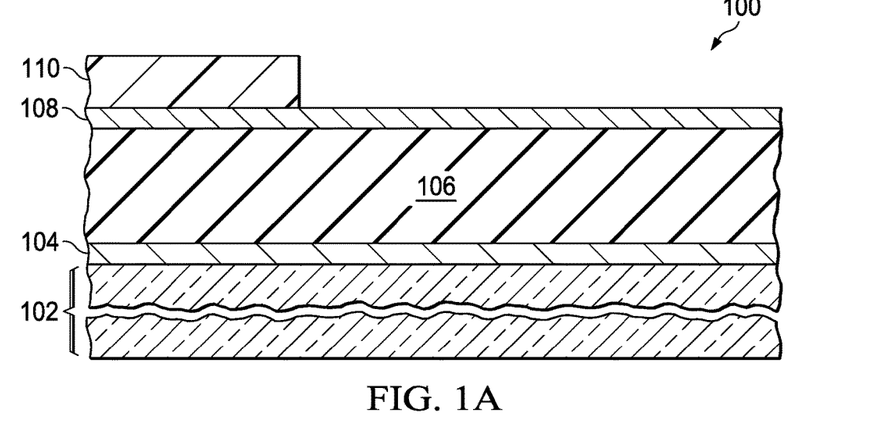
FIG. 1A through FIG. 1P are cross sections of a microelectronic device containing a piezoelectric thin film element, depicted in successive stages of an example fabrication sequence.
Figure 1B:
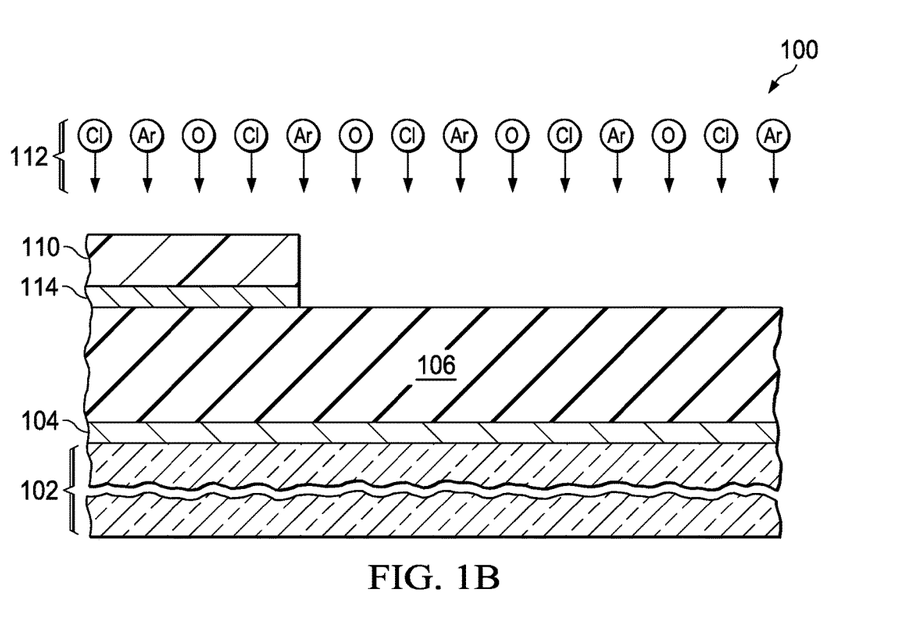
Figure 1C:
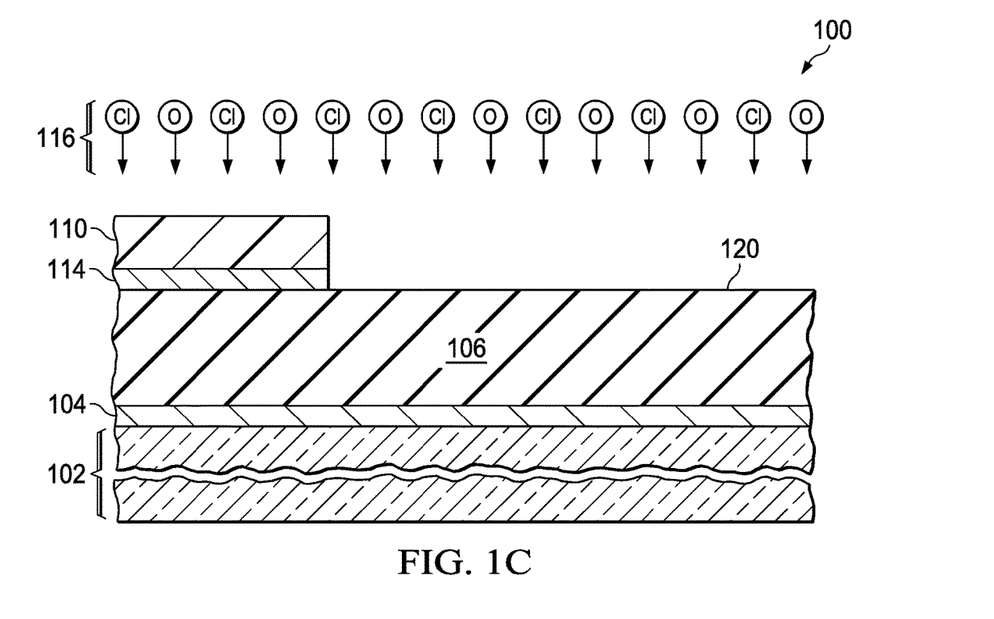
Figure 1D:
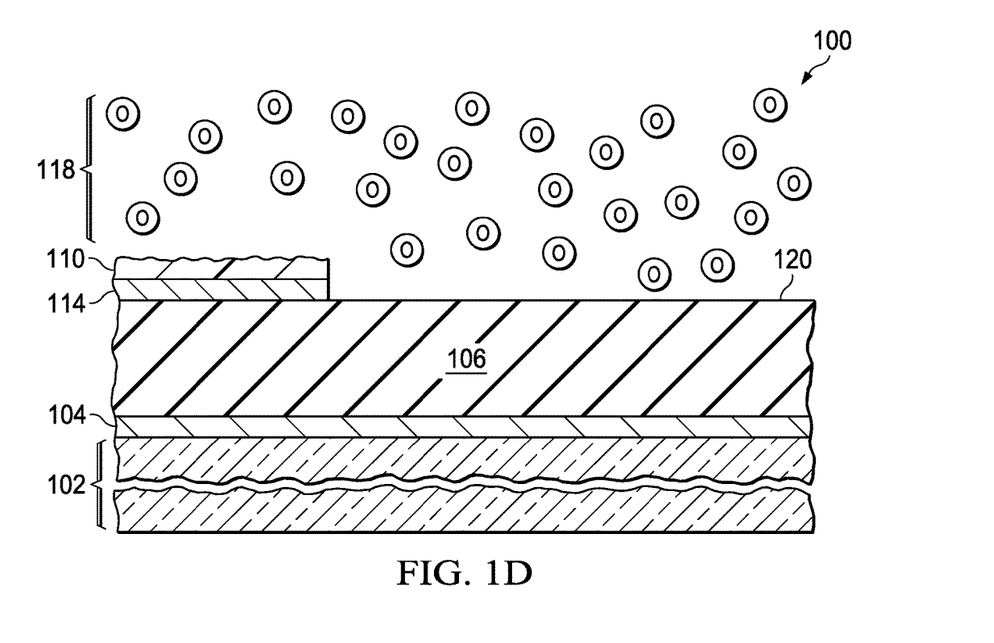
Figure 1E:
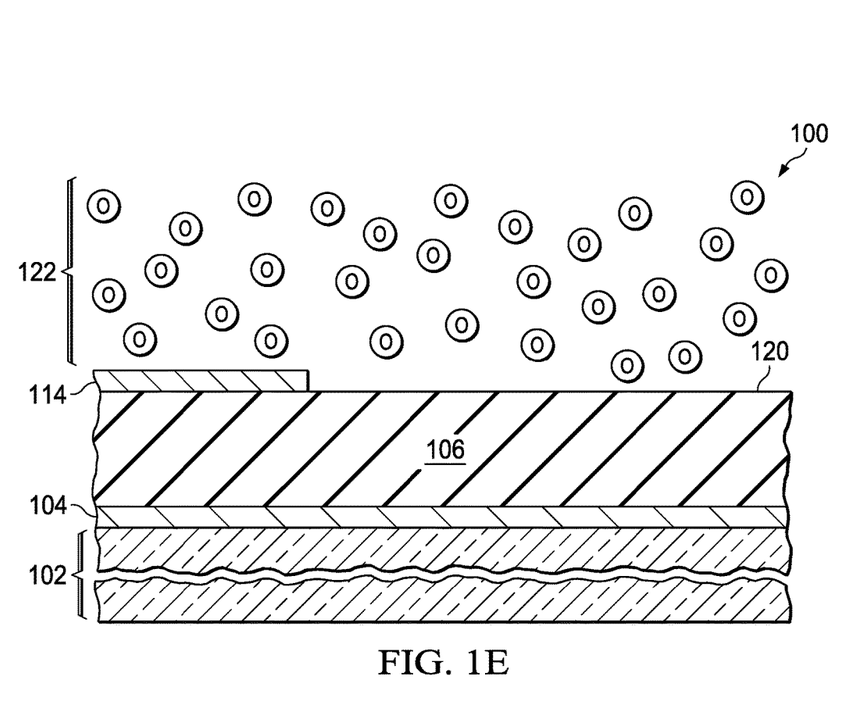
Figure 1F:
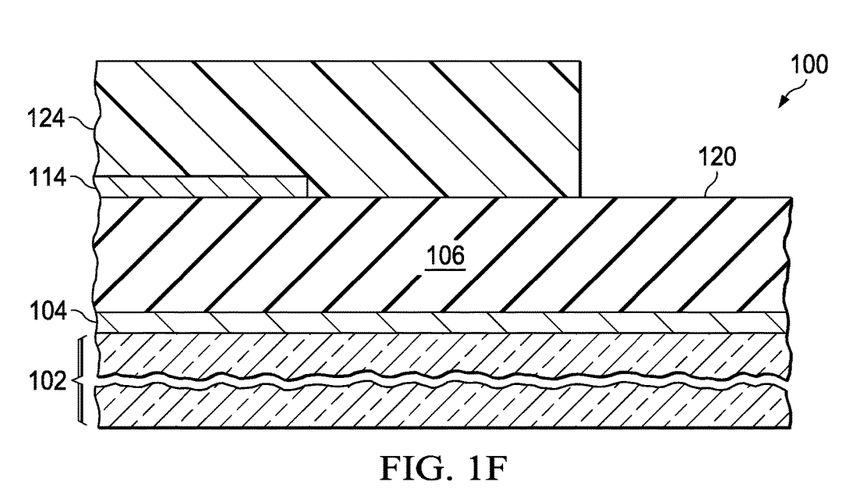
Figure 1G:
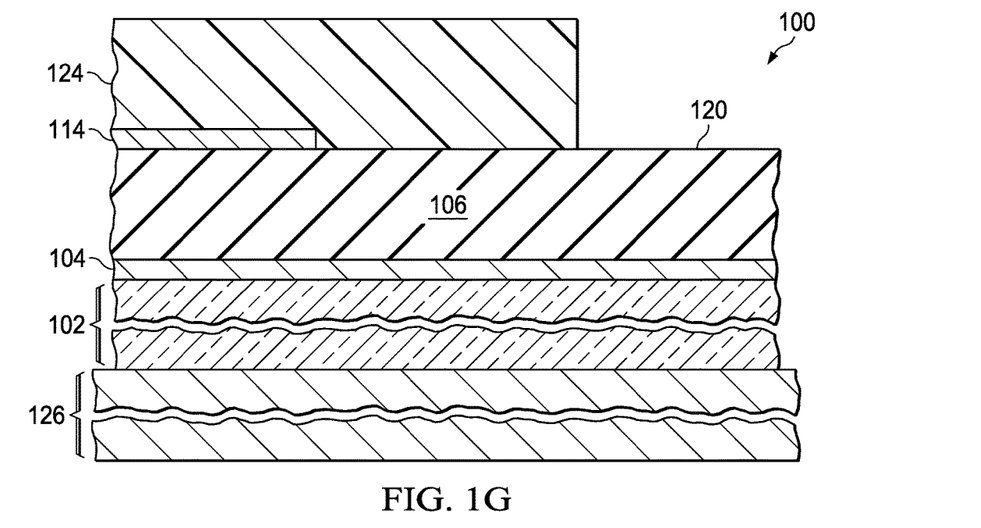
Figure 1H:
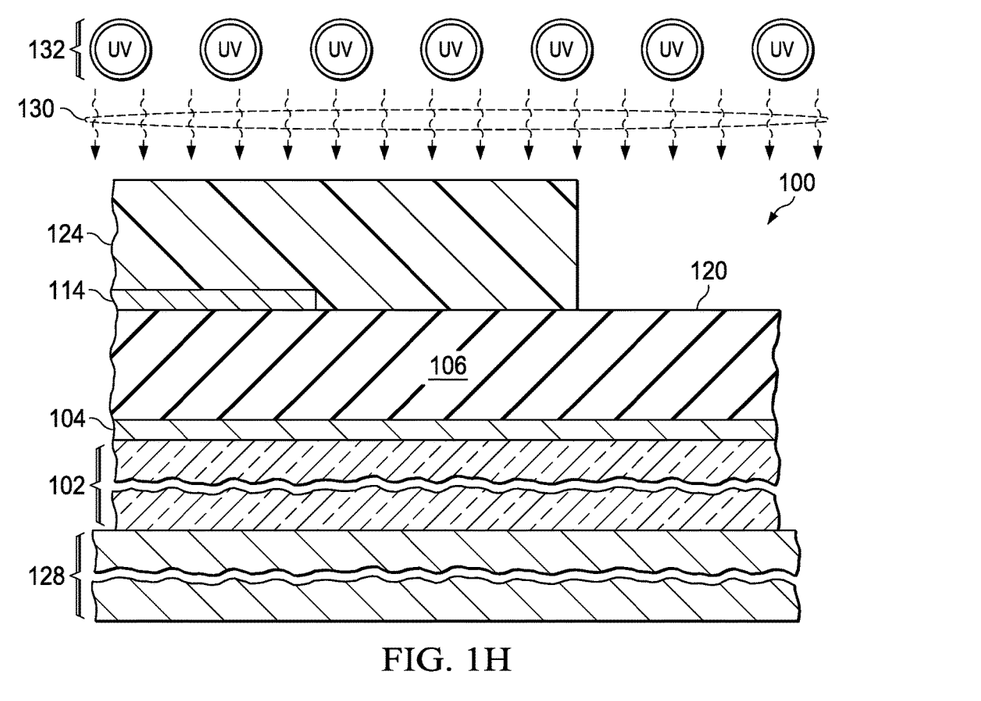
Figure 1I:
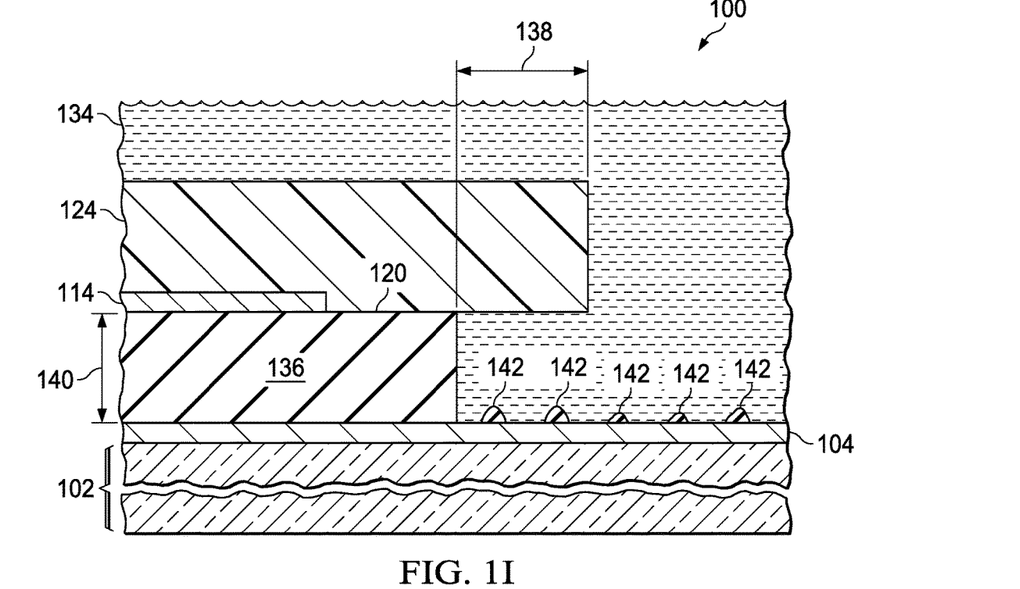
Figure 1J:
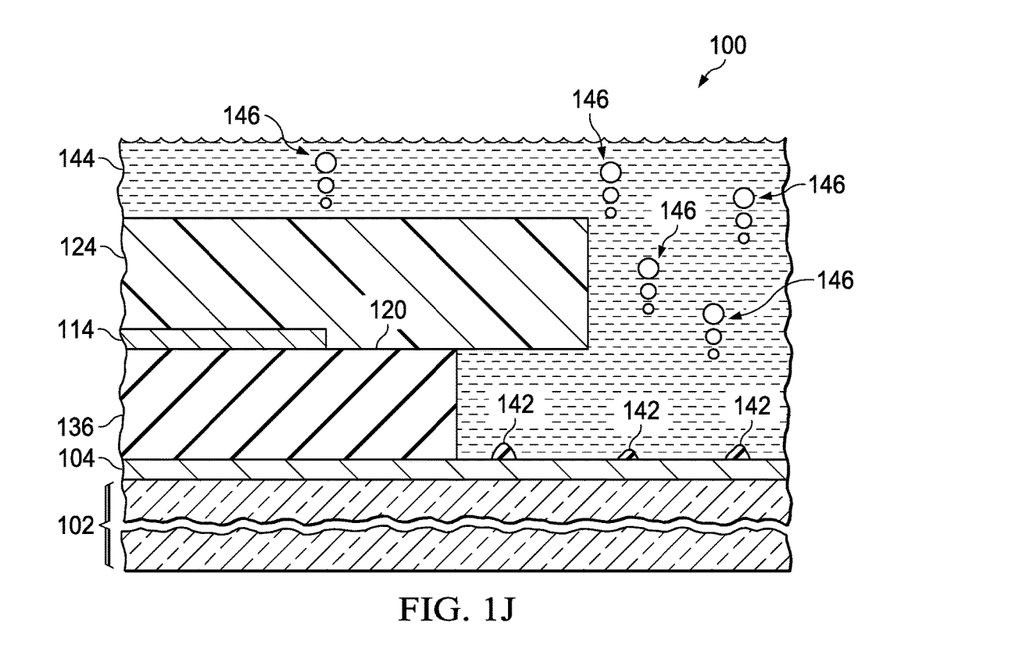
Figure 1K:
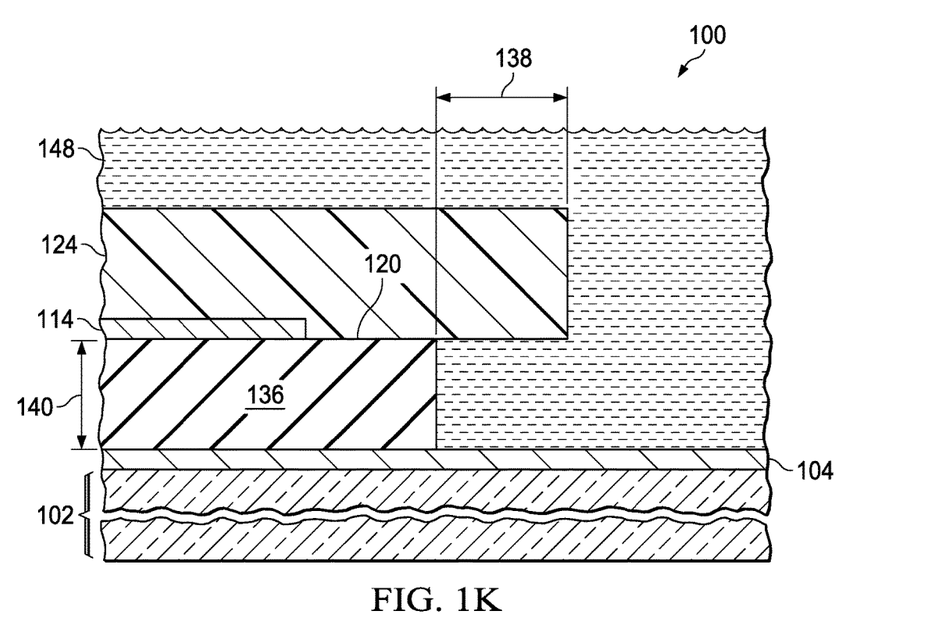
Figure 1L:
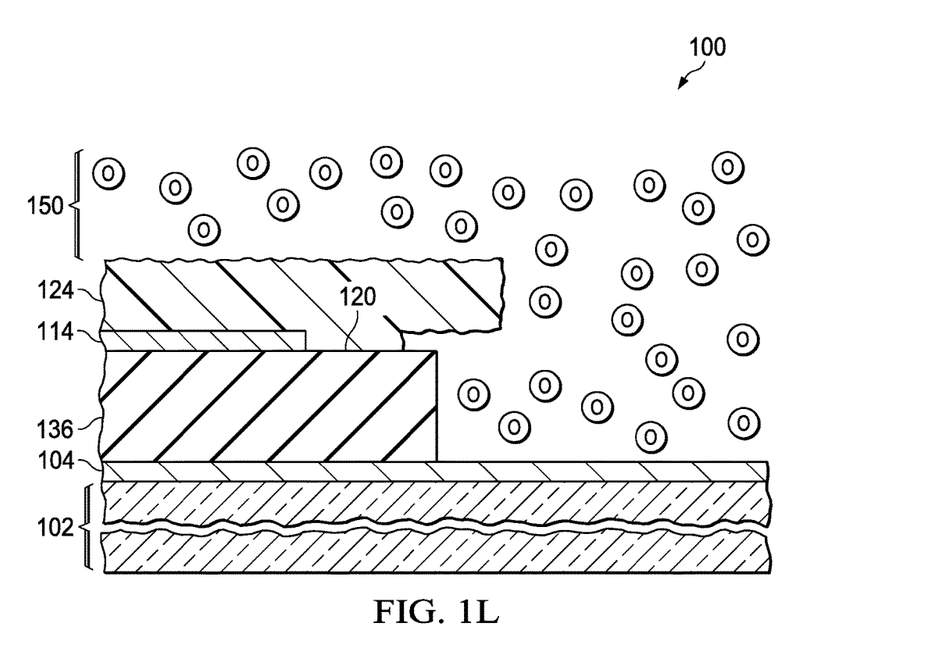
Figure 1M:
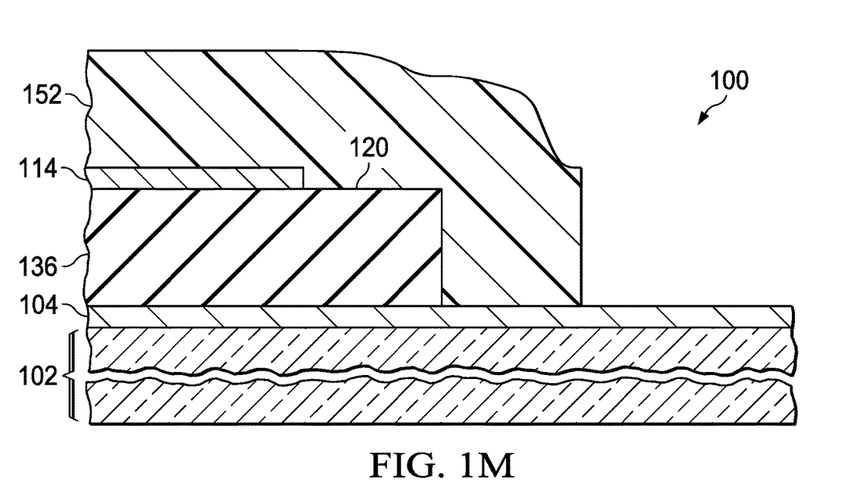
Figure 1N:
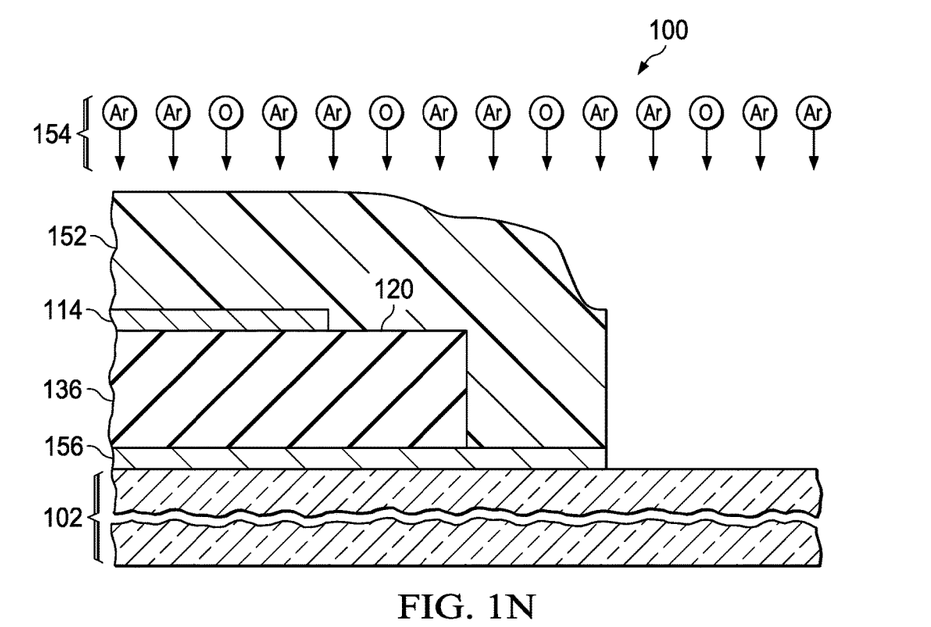
Figure 1O:
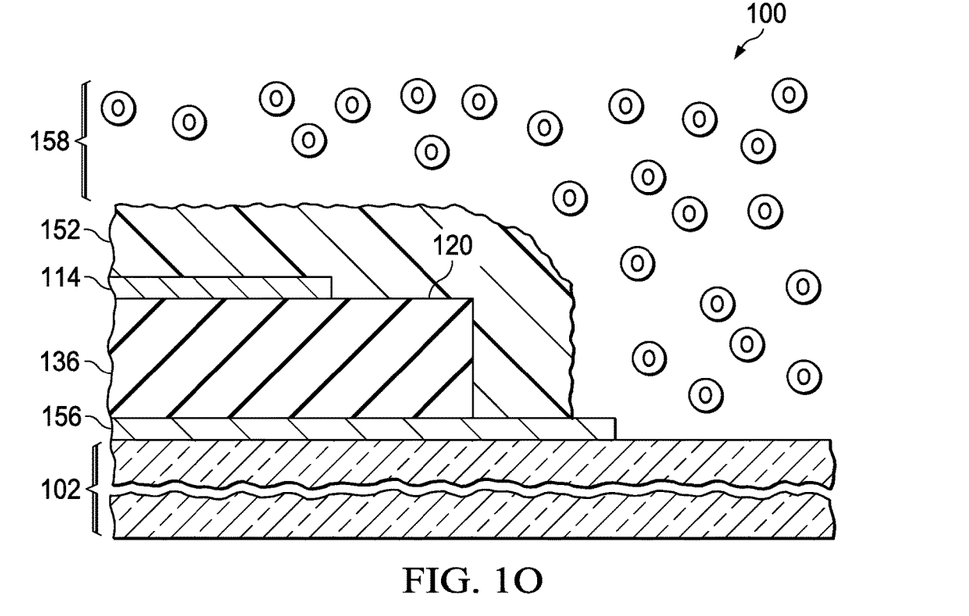
Figure 1P:
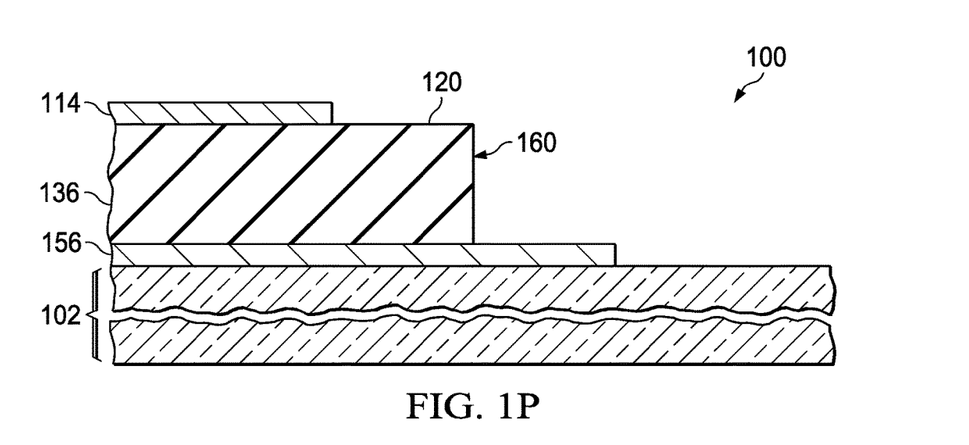

FIG. 1A through FIG. 1P are cross sections of a microelectronic device containing a piezoelectric thin film element, depicted in successive stages of an example fabrication sequence. Referring to FIG. 1A, the microelectronic device 100 has a structural member 102, which may be a monolithic substrate, or may be a movable member such as a membrane or beam. The structural member 102 may include, for example, silicon, sapphire, ceramic, glass, and/or plastic. The structural member 102 may include a dielectric layer at a top surface to provide electrical isolation from the subsequently-formed piezoelectric element. A lower contact layer 104 is formed over the structural member 102. The lower contact layer 104 may include, for example, 75 nanometers to 200 nanometers of platinum with an adhesion layer of titanium. Other materials in the lower contact layer 104 are within the scope of the instant example. A layer of piezoelectric material 106 at least 1 micron thick is formed on the lower contact layer 104. The layer of piezoelectric material 106 may include primarily lead zirconium titanate. An upper contact layer 108 is formed on the layer of piezoelectric material 106. The upper contact layer 108 may include, for example, 75 nanometers to 200 nanometers of platinum.

A top contact mask 110 is formed over the upper contact layer 108 so as to cover an area for a subsequently-formed upper contact. The top contact mask 110 may include photoresist formed by a photolithographic process, and may optionally include an organic anti-reflection layer such as a bottom anti-reflection coat (BARC).

Referring to FIG. 1B, a first dry etch process 112 removes the upper contact layer 108 of FIG. 1A where exposed by the top contact mask 110 to form a top contact 114. The first dry etch process 112 may be, for example, an inductively-coupled reactive ion etch (ICP-RIE) using chlorine radicals, oxygen radicals and argon ions as depicted in FIG. 1B. An example first dry etch process 112 for a 200 millimeter wafer flows boron trichloride ($BCl_3$) at 30 standard cubic centimeters per minute (sccm), chlorine ($Cl_2$) at 60 sccm to 150 sccm, oxygen ($O_2$) at 5 sccm to 20 sccm, and argon (Ar) at 5 sccm to 30 sccm, maintaining a pressure of 8 millitorr to 12 millitorr. Radio frequency (RF) power is applied to an upper electrode over the microelectronic device 100 at 400 watts to 600 watts, which is about 1.3 watts/cm² of wafer area to about 1.9 watts/cm², and RF power is applied to a lower electrode under the microelectronic device 100 at 250 watts to 350 watts, which is about 0.8 watts/cm$^2$ to about 1.1 watts/cm$^2$, for 100 second to 250 seconds, until the upper contact layer 108 is removed where exposed by the top contact mask 110. The first dry etch process 112 may be endpointed to determine when the upper contact layer 108 is removed. The first dry etch process 112 does not remove a significant amount of the piezoelectric layer 106.

Referring to FIG. 1C, an overetch process 116 of the first dry etch process 112 of FIG. 1B conditions a top surface 120 of the layer of piezoelectric material 106 where exposed by the top contact 114. The overetch process 116 includes chlorine radicals and oxygen radicals, and is free of argon. Work performed in pursuit of the instant example has shown that argon in the overetch process 116 deleteriously affects adhesion of a subsequently-formed piezoelectric element mask. In one version of the instant example, the overetch process 116 may terminate the argon flow and reduce the RF power to the lower electrode by 50 watts, which is about 0.16 watts/cm$^2$, while maintaining other parameters the same as in the first dry etch process 112. The overetch process 116 may be a timed process, for example 90 seconds to 150 seconds long. The overetch process 116 may erode at least a portion of the top contact mask 110.

Referring to FIG. 1D, oxygen radicals from an oxygen plasma process 118 oxidize the top surface 120 of the layer of piezoelectric material 106 where exposed by the top contact 114 and remove the remaining top contact mask 110. The oxygen plasma process 118 may be performed in a same chamber as the first dry etch process 112 of FIG. 1B and the overetch process 116 of FIG. 1C, which may advantageously reduce fabrication cost and complexity of the microelectronic device 100. An example oxygen plasma process 118 flows O$_2$ at 100 sccm to 250 sccm while maintaining a pressure of 18 millitorr to 30 millitorr. RF power is applied to the upper electrode at 400 watts to 700 watts, which is about 1.3 watts/cm$^2$ to about 2.2 watts/cm$^2$, and RF power is applied to the lower electrode at 200 watts to 250 watts, which is about 0.6 watts/cm$^2$ to about 0.8 watts/cm$^2$. The oxygen plasma process 118 may be endpointed so as to terminate when the top contact mask 110 is removed, or may be a timed etch, for example 75 seconds to 125 seconds. Oxidation of the top surface 120 of the layer of piezoelectric material 106 by the oxygen plasma process 118 may advantageously increase adhesion of the subsequently-formed piezoelectric element mask. In one version of the instant example, the top contact mask 110 may be removed without using a wet process, such as a wet etch or a wet clean. Removing the top contact mask 110 without using a wet process may advantageously preserve the oxidation of the top surface 120 of the layer of piezoelectric material 106.

Referring to FIG. 1E, an oxygen over-ash process 122 further oxidizes the top surface 120 of the layer of piezoelectric material 106 where exposed by the top contact 114. In one version of the instant example, the oxygen over-ash process 122 may maintain the parameters of the oxygen plasma process 118 of FIG. 1D for a fixed time, for example 50 seconds to 100 seconds. Oxidation of the top surface 120 of the layer of piezoelectric material 106 by the oxygen over-ash process 122 may advantageously further increase adhesion of a subsequently-formed piezoelectric element mask.

Referring to FIG. 1F, a piezoelectric element mask 124 is formed over the layer of piezoelectric material 106 so as to cover an area for the subsequently-formed piezoelectric element. In the instant example, the piezoelectric element mask 124 covers and extends past the top contact 114 by at least a micron. The piezoelectric element mask 124 may include photoresist, for example a negative photoresist comprising polyisoprene-based polymer, formed by a photolithographic process, and may optionally include a BARC layer. A solvent such as an aqueous amine solution with a pH of 11 to 12 may optionally be applied to the microelectronic device 100 prior to forming the piezoelectric element mask 124 to promote adhesion of the photoresist to the top surface 120.

Referring to FIG. 1G, the microelectronic device 100 is placed on a first heated structure 126 such as a hot plate or oven plate. The microelectronic device 100 is baked at 180° C. to 190° C. for 45 minutes to 90 minutes. The microelectronic device 100 may be baked in an atmospheric ambient, or may be baked in an inert ambient such as a nitrogen ambient. Baking the microelectronic device 100 may advantageously improve adhesion of the piezoelectric element mask 124 to the layer of piezoelectric material 106 and improve resistance of the piezoelectric element mask 124 to a subsequent wet etch process.

Referring to FIG. 1H, the microelectronic device 100 is placed on a second heated structure 128 and exposed to UV radiation 130 from one or more UV sources 132 for 90 seconds to 150 seconds. The UV sources 132 may be, for example, low intensity UV sources with power densities from 80 milliwatts/cm$^2$ to 108 milliwatts/cm$^2$ or high intensity UV sources with power densities from 225 milliwatts/cm$^2$ to 280 milliwatts/cm$^2$. The microelectronic device 100 may be heated to 200° C. to 250° C. while exposed to the UV sources 132. Baking the piezoelectric element mask 124 under the UV sources 132 may advantageously further improve adhesion of the piezoelectric element mask 124 to the layer of piezoelectric material 106 and further improve resistance of the piezoelectric element mask 124 to the subsequent wet etch process.

Referring to FIG. 1I, a first wet etch 134 of a three step process removes the layer of piezoelectric material 106 of FIG. 1H where exposed by the piezoelectric element mask 124, to form a piezoelectric element 136. The first wet etch 134 is an aqueous solution of 4.5 percent to 5.5 percent ammonium fluoride (NH$_4$F), 1.1 percent to 1.3 percent hydrofluoric acid (HF), and 16.5 percent to 19.5 percent hydrochloric acid (HCl), wherein a ratio of the HCl to the HF is maintained at a value of 14.5 to 15.5. The first wet etch 134 may expose the lower contact layer 104. Maintaining the ratio of the HCl to the HF advantageously controls horizontal etching of the layer of piezoelectric material 106 so that an undercut distance 138 of the piezoelectric element 136 under the piezoelectric element mask 124 is less than three times a thickness 140 of the layer of piezoelectric material 106. Oxidizing the top surface 120 of the layer of piezoelectric material 106 as described in reference to FIG. 1D and forming the piezoelectric element mask 124 as described in reference to FIG. 1E through FIG. 1H advantageously reduce separation of the piezoelectric element mask 124 from the top surface 120 during the first wet etch 134. Etch residue 142 which has a low solubility in water may be present on the lower contact layer 104 after the first wet etch 134 is completed.

Referring to FIG. 1J, the microelectronic device 100 is exposed to an agitated rinse process 144, which is a second step of the three step process. The agitated rinse process 144 may include substantially all deionized water (DI H$_2$O), with a source of mechanical agitation. In the instant example, the source of mechanical agitation may be nitrogen bubbling, indicated in FIG. 1J as bubbles 146. Other methods of providing the mechanical agitation are within the scope of the instant example. The mechanical agitation of the agitated rinse process 144 may advantageously remove a portion of the etch residue 142 and may advantageously remove a crust on remaining etch residue 142 to facilitate removal in a third step of the three step process.

Referring to FIG. 1K, a second wet etch 148, with an aqueous solution having substantially a same composition as the first wet etch 134 of FIG. 1I, removes any remaining etch residue 142 of FIG. 1J. The second wet etch 148 may be performed for a short time, for example 5 seconds to 20 seconds. The undercut distance 138 of the piezoelectric element 136 under the piezoelectric element mask 124 remains less than three times the thickness 140 of the piezoelectric element 136. After the second wet etch 148 is completed the aqueous solution of the second wet etch 148 is removed by a rinse process, for example a series of three rinse and dump steps.

Referring to FIG. 1L, oxygen radicals 150 of an oxygen ash process remove the piezoelectric element mask 124. The oxygen radicals 150 do not remove a significant amount of the piezoelectric element 136. A wet clean is not used to remove the piezoelectric element mask 124, nor is a wet clean used to remove residue following the oxygen ash process.

Referring to FIG. 1M, a bottom contact mask 152 is formed over the top contact 114 and the piezoelectric element 136, extending partway onto the lower contact layer 104. The bottom contact mask 152 may include photoresist, and may be thicker than the top contact mask 110 of FIG. 1A so as to cover the piezoelectric element 136. The bottom contact mask 152 may extend past the piezoelectric element 136 by at least 1 micron.

Referring to FIG. 1N, a second dry etch process 154 removes the lower contact layer 104 of FIG. 1M where exposed by the bottom contact mask 152 to form a bottom contact 156. The second dry etch process 154 may be similar to the first dry etch process 112 described in reference to FIG. 1B.

Referring to FIG. 1O, oxygen radicals 158 from an oxygen plasma process remove the bottom contact mask 152. A wet clean is not used to remove the bottom contact mask 152, nor is a wet clean used to remove residue following the oxygen ash process.

FIG. 1P shows the completed piezoelectric element 136. Forming the microelectronic device 100 according to the process described herein may provide the piezoelectric element 136 with a desired extension past the top contact 114 and a desired side profile 160 which is substantially vertical.

Figure 2:
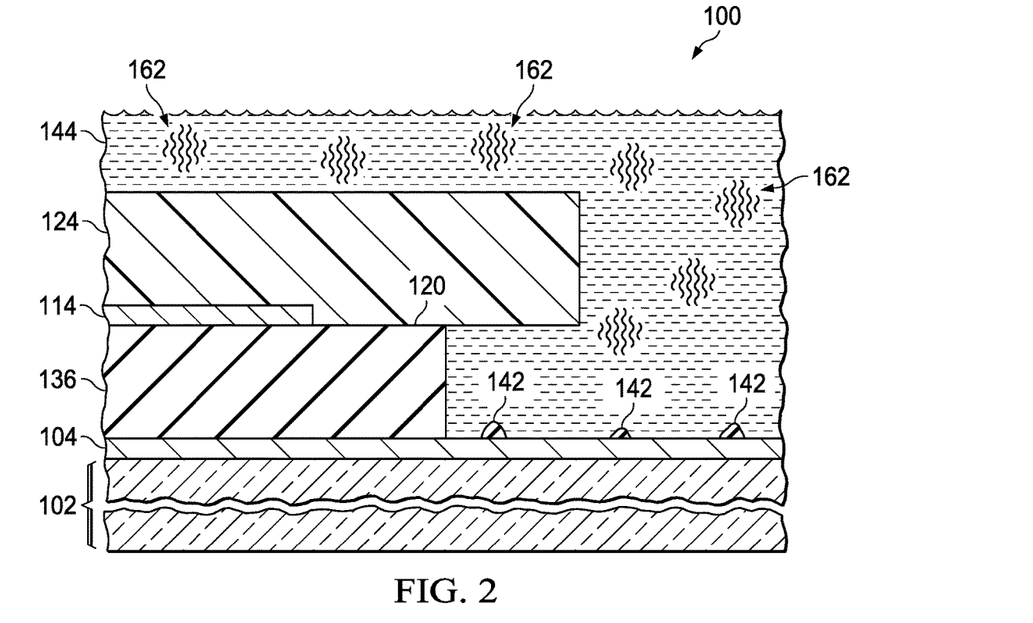
FIG. 2 depicts the microelectronic device of FIG. 1J in an alternate agitated rinse process.

FIG. 2 depicts the microelectronic device of FIG. 1J in an alternate agitated rinse process. In the instant example, the agitated rinse process 144 is a DI H$_2$O rinse with ultrasonic power applied to the deionized water, possibly a megasonic process, generating ultrasonic waves 162 in the deionized water which provide the agitation. The ultrasonic waves 162 may be advantageously effective at eliminating the etch residue 142 and may be advantageously effective at removing the crust on remaining etch residue 142 to facilitate removal in the second wet etch process 148 of FIG. 1K.

Figure 3:
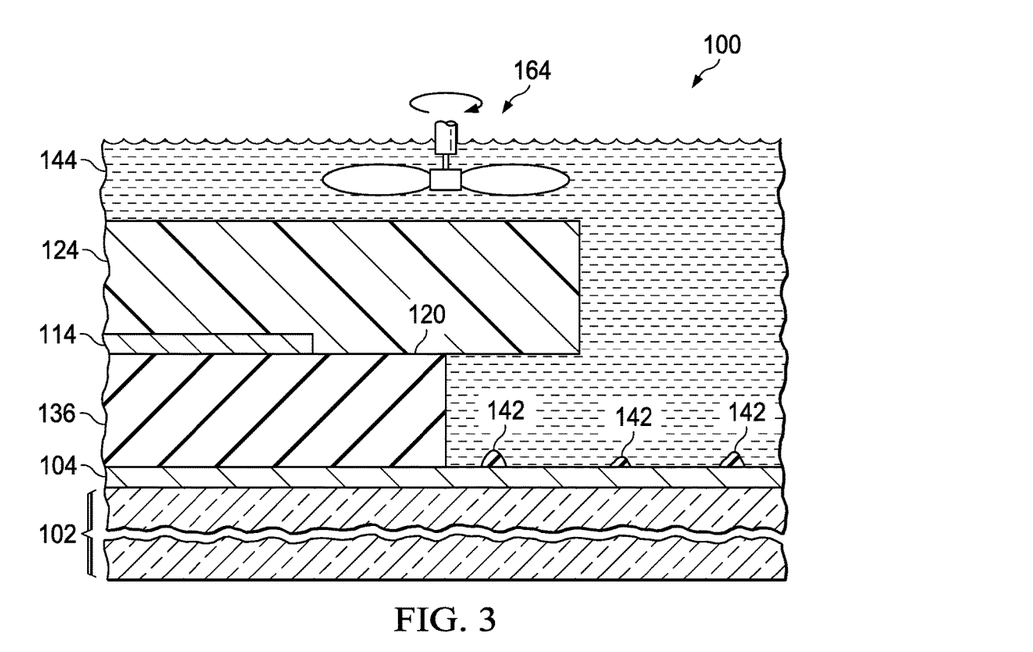
FIG. 3 depicts the microelectronic device of FIG. 1J in another version of the agitated rinse process.

FIG. 3 depicts the microelectronic device of FIG. 1J in another version of the agitated rinse process. In the instant example, the agitated rinse process 144 is a DI H$_2$O rinse which is stirred by a stirring mechanism 164, generating flow in the deionized water which provides the agitation. The agitation may be advantageously effective at eliminating the etch residue 142 and may be advantageously effective at removing the crust on remaining etch residue 142 to facilitate removal in the second wet etch process 148 of FIG. 1K.

Figure 4:
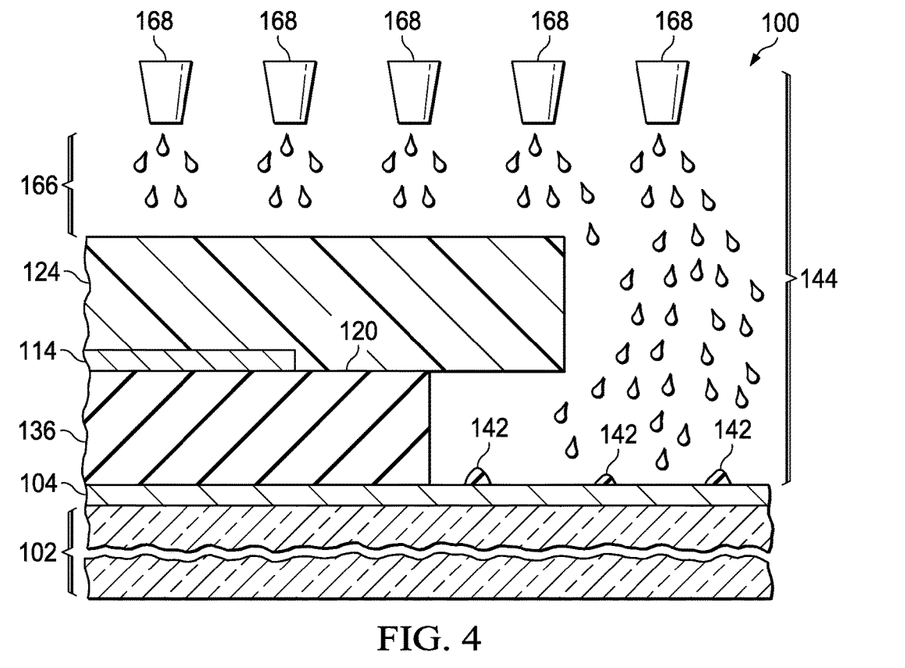
FIG. 4 depicts the microelectronic device of FIG. 1J in a further version of the agitated rinse process.

FIG. 4 depicts the microelectronic device of FIG. 1J in a further version of the agitated rinse process. In the instant example, the agitated rinse process 144 is a DI H$_2$O spray rinse 166, possibly a high pressure spray rinse, for example above 100 pounds per square inch (psi), which is provided by one or more spray nozzles 168. Mechanical force is generated when the sprayed deionized water impacts the etch residue 142, thus providing the agitation. The agitation may be advantageously effective at eliminating the etch residue 142 and may be advantageously effective at removing the crust on remaining etch residue 142 to facilitate removal in the second wet etch process 148 of FIG. 1K.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a microelectronic device, comprising the steps:
   providing a structural member;
   forming a lower contact layer over the structural member;
   forming a layer of piezoelectric material on the lower contact layer;
   forming a top contact on the layer of piezoelectric material;
   exposing a top surface of the layer of piezoelectric material, where exposed by the top contact, to an oxygen plasma;
   forming a piezoelectric element mask on the layer of piezoelectric material, extending past the top contact;
   thermally baking the piezoelectric element mask;
   baking the piezoelectric element mask while exposing the piezoelectric element mask to ultraviolet (UV) radiation;
   removing at least a portion of the layer of piezoelectric material, where exposed by the piezoelectric element mask, by a first wet etch using an etch chemistry;
   exposing the microelectronic device to an agitated rinse process;
   exposing the layer of piezoelectric material to a second wet etch comprising the etch chemistry; and
   removing the piezoelectric element mask.

2. The method of claim 1, wherein the layer of piezoelectric material comprises primarily lead zirconium titanate.

3. The method of claim 1, comprising an overetch process after removing the upper contact layer and before exposing the top surface of the layer of piezoelectric material to the oxygen plasma, wherein the overetch process comprises forming a plasma with chlorine-containing gas and oxygen over the top surface, the plasma of the overetch process being substantially free of argon.

4. The method of claim 1, comprising an over-ash process after exposing the top surface of the layer of piezoelectric material to the oxygen plasma and before forming the piezoelectric element mask, wherein the over-ash process exposes the top surface of the layer of piezoelectric material to the oxygen plasma after the top contact mask is removed for 50 seconds to 100 seconds.

5. The method of claim 1, wherein thermally baking the piezoelectric element mask comprises baking at 180° C. to 190° C. for 45 minutes to 90 minutes.

6. The method of claim 1, wherein the etch chemistry comprises an aqueous solution of 4.5 percent to 5.5 percent $NH_4F$, 1.1 percent to 1.3 percent HF, and 16.5 percent to 19.5 percent HCl, wherein a ratio of the HCl to the HF is maintained at a value of 14.5 to 15.5.

7. The method of claim 1, wherein the agitated rinse process is selected from the group consisting of:
a deionized water (DI $H_2O$) rinse with nitrogen bubbling;
a deionized water (DI $H_2O$) rinse with ultrasonic power applied to the DI $H_2O$; and
a deionized water (DI $H_2O$) rinse which is stirred by a stirring mechanism.

8. The method of claim 1, wherein the agitated rinse process comprises a DI $H_2O$ spray rinse.

9. The method of claim 1, wherein the top contact layer comprises a layer of platinum.

10. The method of claim 1, wherein the bottom contact layer comprises a layer of platinum over an adhesion layer.

11. A method of forming a microelectronic device, comprising the steps:
forming a layer of piezoelectric material over a substrate;
exposing a top surface of the layer of piezoelectric material to an oxygen plasma;
forming a piezoelectric element mask on the layer of piezoelectric material;
thermally baking the piezoelectric element mask;
baking the piezoelectric element mask while exposing the piezoelectric element mask to ultraviolet (UV) radiation;
removing at least a portion of the layer of piezoelectric material, where exposed by the piezoelectric element mask, by a first wet etch using an etch chemistry;
exposing the microelectronic device to a rinse process;
exposing the layer of piezoelectric material to a second wet etch comprising the etch chemistry; and
removing the piezoelectric element mask.

12. The method of claim 11, wherein the layer of piezoelectric material comprises primarily lead zirconium titanate.

13. The method of claim 11, wherein thermally baking the piezoelectric element mask comprises baking at 180° C. to 190° C. for 45 minutes to 90 minutes.

14. The method of claim 11, wherein the etch chemistry comprises an aqueous solution of $NH_4F$, HF, and HCl.

15. The method of claim 11, wherein the etch chemistry comprises an aqueous solution of 4.5 percent to 5.5 percent $NH_4F$, 1.1 percent to 1.3 percent HF, and 16.5 percent to 19.5 percent HCl, wherein a ratio of the HCl to the HF is maintained at a value of 14.5 to 15.5.

16. The method of claim 11, wherein the rinse process is an agitated rinse process selected from the group consisting of:
a deionized water (DI $H_2O$) rinse with nitrogen bubbling;
a deionized water (DI $H_2O$) rinse with ultrasonic power applied to the DI $H_2O$; and
a deionized water (DI $H_2O$) rinse which is stirred by a stirring mechanism.

17. A method of forming a microelectronic device, comprising the steps:
forming a layer of piezoelectric material over a substrate;
forming a piezoelectric element mask on the layer of piezoelectric material;
removing at least a portion of the layer of piezoelectric material, where exposed by the piezoelectric element mask, by a first wet etch comprising an aqueous solution of ammonium fluoride ($NH_4F$), hydrofluoric acid (HF), and hydrochloric acid (HCl);
exposing the microelectronic device to an agitated rinse process;
exposing the layer of piezoelectric material to a second wet etch comprising an aqueous solution of $NH_4F$, HF, and HCl;
removing the aqueous solution of the second wet etch by a rinse process; and
removing the piezoelectric element mask.

18. The method of claim 17, wherein:
the first wet etch comprises an aqueous solution of 4.5 percent to 5.5 percent $NH_4F$, 1.1 percent to 1.3 percent HF, and 16.5 percent to 19.5 percent HCl, wherein a ratio of the HCl to the HF is maintained at a value of 14.5 to 15.5; and
the second wet etch comprises an aqueous solution of 4.5 percent to 5.5 percent $NH_4F$, 1.1 percent to 1.3 percent HF, and 16.5 percent to 19.5 percent HCl, wherein a ratio of the HCl to the HF is maintained at a value of 14.5 to 15.5.

19. The method of claim 17, wherein the agitated rinse process is selected from the group consisting of:
a deionized water (DI $H_2O$) rinse with nitrogen bubbling;
a deionized water (DI $H_2O$) rinse with ultrasonic power applied to the DI $H_2O$; and
a deionized water (DI $H_2O$) rinse which is stirred by a stirring mechanism.

20. The method of claim 17, wherein the layer of piezoelectric material comprises primarily lead zirconium titanate.

* * * * *